United States Patent [19]

Culican et al.

[11] Patent Number: 4,656,367
[45] Date of Patent: Apr. 7, 1987

[54] SPEED UP OF UP-GOING TRANSITION OF TTL OR DTL CIRCUITS UNDER HIGH CAPACITIVE LOAD

[75] Inventors: Edward F. Culican, Hyde Park; Philip E. Pritzlaff, Jr., Highland, both of N.Y.; Helmut Schettler, Dettenhausen, Fed. Rep. of Germany; Kenneth A. Van Goor, Salt Point, N.Y.

[73] Assignee: International Business Machines Corporation, Armonk, N.Y.

[21] Appl. No.: 789,250

[22] Filed: Oct. 18, 1985

[51] Int. Cl.⁴ .................. H03K 3/01; H03K 3/26; H03K 3/33; H03K 17/16

[52] U.S. Cl. .................. 307/270; 307/300; 307/443; 307/456

[58] Field of Search ............... 307/443, 454, 456, 270, 307/254, 300

[56] References Cited

U.S. PATENT DOCUMENTS

| | | | |
|---|---|---|---|
| 3,439,186 | 4/1969 | Seelbach | 307/457 |
| 3,457,435 | 7/1969 | Burns et al. | 307/251 |
| 3,491,251 | 1/1970 | Witsell | 307/443 |
| 3,560,760 | 2/1970 | Chung et al. | 307/456 |
| 3,576,445 | 4/1971 | Habib | 307/456 |
| 3,603,816 | 9/1971 | Podraza | 307/247 |
| 3,727,081 | 4/1973 | Davis et al. | 307/260 |
| 3,867,644 | 2/1975 | Cline | 307/457 |
| 4,000,429 | 12/1976 | Yoshida et al. | 307/246 |
| 4,070,589 | 1/1978 | Martinkovic | 307/246 |
| 4,071,783 | 1/1978 | Knepper | 307/270 |
| 4,110,637 | 8/1978 | Rusznyak | 307/238 |
| 4,137,464 | 1/1979 | Heller et al. | 307/227 |
| 4,250,411 | 2/1981 | Kriedt | 307/264 |
| 4,344,003 | 8/1982 | Harmon et al. | 307/296 |
| 4,424,456 | 1/1984 | Shiraki et al. | 307/268 |
| 4,491,748 | 1/1985 | Chappell et al. | 307/270 |

OTHER PUBLICATIONS

I.B.M. Tech. Disc. Bul., vol. 26, No. 5, 10/83, "Compatible Circuits Implemented in DDL and TTL Technology".

Primary Examiner—Stanley D. Miller
Assistant Examiner—M. R. Wambach
Attorney, Agent, or Firm—Wesley DeBruin

[57] ABSTRACT

A circuit for enhancing the ability of digital circuits to drive highly capacitive loads is disclosed. The circuit has particular utility when employed with logic circuits such as "TTL" (Transistor-Transistor Logic) and "DTL" (Diode-Transistor Logic).

5 Claims, 4 Drawing Figures

LINE CHARGER CIRCUIT

LINE CHARGER CIRCUIT

USE OF THE "LINE CHARGER" IN A HEAVILY LOADED NET

RISING DELAY IMPROVEMENT DUE TO LINE CHARGER

4,656,367

SPEED UP OF UP-GOING TRANSITION OF TTL OR DTL CIRCUITS UNDER HIGH CAPACITIVE LOAD

BACKGROUND OF THE INVENTION

The invention relates generally to circuits for digital equipment and more particularly to circuitry for enhancing the ability of digital circuits to drive highly capacitive loads. The circuitry in accordance with the invention has particular utility when employed with logic circuits such as "TTL" (Transistor-Transistor Logic) and "DTL" (Diode Transistor Logic).

DESCRIPTION OF THE PRIOR ART

In the interconnection of voltage mode circuits such as TTL and DTL it is probable that the circuits will be required to drive a high capacitance net. The high capacitance can be attributed to long lengths of interconnecting wire and the inputs of the loading gates. The speed of a down going transition of the voltage mode circuit is dominated by the ability of the output transistor of the driving circuit to discharge the load capacitance. The speed of the up going transition of the driving circuit is determined by the value of the output pull-up resistor. The value of the output pull-up resistor is usually optimized for the more common low capacitance load. Thus the up going transition speed of such a gate will be poor.

A number of circuits directed to the rapid and/or controlled charge and/or discharge of a highly capacitive load, or line, are known to the art.

BACKGROUND ART

U.S. Patents

U.S. Pat. No. 3,457,435 entitled "Complementary Field-Effect Transistor Transmission Gate" granted July 22, 1969 to J. R. Burns et al.

U.S. Pat. No. 3,603,816 entitled "High Speed Digital Circuits" granted Sept. 7, 1981 to G. V. Podraza.

U.S. Pat. No. 3,727,081 entitled "Regulator For Controlling Capacitor Charge To Provide Complex Waveform" granted Apr. 10, 1973 to W. F. Davis et al.

U.S. Pat. No. 4,000,429 entitled "Semiconductor Circuit Device" granted Dec. 28, 1976 to K. Yoshida et al.

U.S. Pat. No. 4,070,589 entitled "High Speed High Voltage Switching With Low Power Consumption" granted Jan. 24, 1978 to D. J. Martinkovic.

U.S. Pat. No. 4,071,783 entitled "Enhancement/Depletion Mode Field Effect Transistor Driver" granted Jan. 31, 1978 to R. W. Knepper.

U.S. Pat. No. 4,110,637 entitled "Electronic System For Capacitively Storing A Signal Voltage Of Predetermined Level" granted Aug. 29, 1978 to A. Rusznyak.

U.S. Pat. No. 4,137,464 entitled "Charge-Transfer Binary Search Generating Circuit" granted Jan. 30, 1979 to L. G. Heller et al.

U.S. Pat. No. 4,250,411 entitled "Dynamic Resistor Current Leakage Compensation Arrangement" granted Feb. 10, 1981 to H. Kriedt.

U.S. Pat. No. 4,344,003 entitled "Low Power Voltage Multiplier Circuit" granted Aug. 10, 1982 to J. W. Harmon et al U.S. Pat. No. 4,424,456 entitled "Driver Circuit For Charge Coupled Device" granted Jan. 3, 1984 to R. Shiraki et al.

SUMMARY OF THE INVENTION

The up-going transition of TTL or DTL circuits employing passive pull-up circuit means (such as one or more resistors) is slow when applied, or driving, a high capacitive load. This effect is a significant problem for VLSI logic chips. The invention may be summarized as a line charging, or speed-up, circuit the employment of which materially increases the speed with which a logic circuit, or the like, can drive, or charge-up a high capacitive load. The "speed-up" circuit includes a transistor circuit means for rapidly charging the capacitive load and also transistor circuit means for isolating the input of the charging circuit from the output of the charging circuit during the up-going transition of an input signal, i.e. charging of the capacitive load. The charging circuit further includes means for aiding the discharge of the capacitive load during a down-level transition of an input signal.

Reference is made to the following text for a full and complete description of DTL and TTL logic circuits. "Digital Integrated Electronics" by Herbert Taub and Donald Schilling, published by Mc-Graw Hill Book Company, copyright 1977.

DTL and TTL logic circuits are well known and extensively taught in the art. Further complete descriptions of Diode Transistor Logic Circuits and Transistor—Transistor logic circuits are set-forth in the following texts:

(1) "Electronic Principles, Physics Modules and Circuits" by Paul E. Gray and Campbell L. Searle (Massachusetts Institute of Technology) copyright 1969 by John Wiley & Sons, Inc., page 848–849.

(2) "The Design of Digital Systems" by John B. Peatman (Georgia Institute of Technology) copyright 1972 by McGraw-Hill, Inc., pages 382–401.

These and other features and advantages of the invention will be apparent from the following more particular description of the preferred embodiment of the invention as illustrated in the accompanying drawings.

DESCRIPTION OF THE PREFERRED EMBODIMENT

Figure 2:
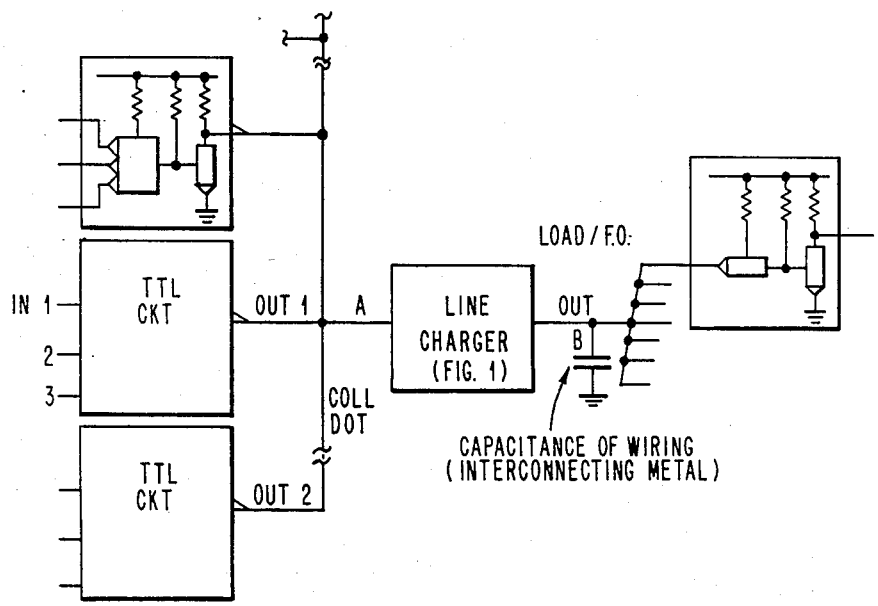
FIG. 2 is a block diagram of the line charger as employed in a typical logic gate configuration. It should be noted that the maximum benefit of the line charger is achieved when the line charger is physically located near the driving circuits. The capacitor pictured on the output of the line charger represents the land capacitance of the metal connecting the output of the driving circuits to the input of the load circuits.

In FIG. 2 the speed-up circuit (line charger circuit) has its input connected to the collector dot output of three TTL circuits. The output of the line charger circuit is connected to the emitter input of a number of TTL circuits. The capacitor shown in FIG. 2, at the output of the line charger, represents the high capacitance load attributable to the circuitry connected to the output of the line charger. In the drawing the capacitor and the legend "capacitance of wiring (interconnecting metal)" represent the capacitive load on the output of the line charger circuit due to wiring and circuitry, such as logical circuits. Still referring to FIG. 2, the legend "Load/F.O." (load fan-out) further designate the circuitry, such as logical circuits connected to the output of the line charger circuit. It will be understood by persons skilled in the art that applicants invention is not to be construed as limited to the circuitry expressly shown in the drawing.

Figure 1:
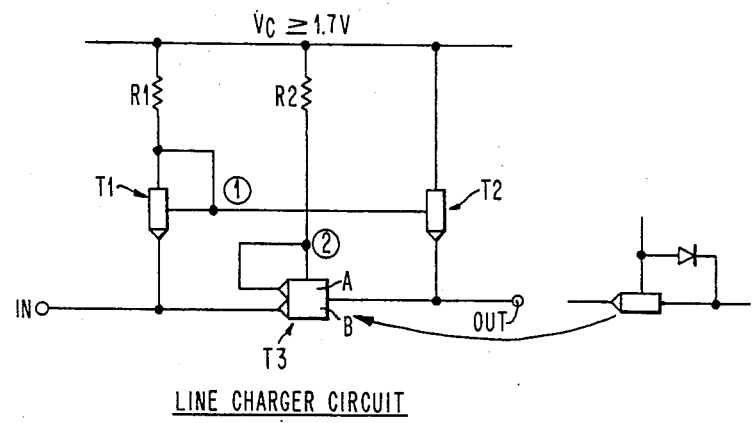
FIG. 1 is the schematic diagram of the line charger or speed-up circuit in accordance with the invention.

The up-going transition of TTL or DTL circuits is slow when applied to a high capacitive load. This effect turns out to be a major problem for VLSI logic chips. The circuit shown in FIG. 1 is an active pullup circuit to be connected between the output of the driving circuit and its load as shown in FIG. 2. The operation of the speed-up circuit is as follows. With the output of the TTL gate in FIG. 2 at a down level the components of the attached line charger as shown in FIG. 1 will be as follows. The base to emitter diode formed by transistor T1 will be forward biased clamping the voltage at node 1 to a $V_{BE}$ above the input voltage. Likewise, the base to emitter junction of transistor T3B will be forwarded biased causing T3B to operate in the saturated mode. In order to reduce base to collector voltage of T3B in the saturated mode the base to collector of the transistor is integrated in parallel. The relation of the output voltage and the input voltage will be governed by the collector to emitter saturation voltage ($V_{CE\,SAT}$) of T3B. Transistor T2 will not be conducting current in this mode since the voltage from node 1 to the output node is not great enough to forward bias the base to emitter junction of T2.

The operation of the Line Charger while stimulated by an upgoing transition is as follows. The voltage at node 1 will rise along with the input voltage. The rising voltage at node 1 will activate transistor T2. The current conducted from collector to emitter of device T2 will charge the load capacitance connected to the output. Transistor T3B isolates the effect of the load capacitance at the output from the input during this transition.

With the input at the up state the circuit operation is as follows. The input voltage, node 1 and node 2, will have risen to $V_C$. Transistors T1, T3A and T3B will be inactive. Transistor T2 will be forward biased clamping the output voltage to a $V_{BE}$ below the supply voltage $V_C$.

During the input falling transition transistors T1 and T3B are forward biased and transistor T2 becomes inactive. With T3B active the load capacitance at the output is discharged and the output voltage falls to the low state.

Figure 3:
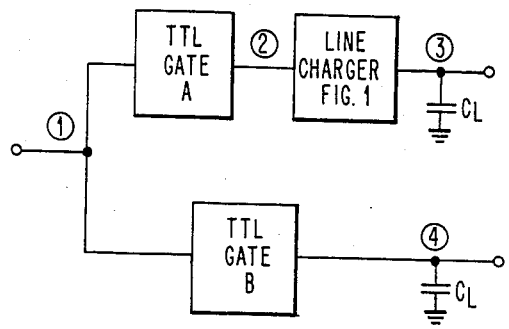
FIG. 3 discloses the simulated block diagram circuits employed to determine the delta in switching speed provided by the line charger.
Figure 4:
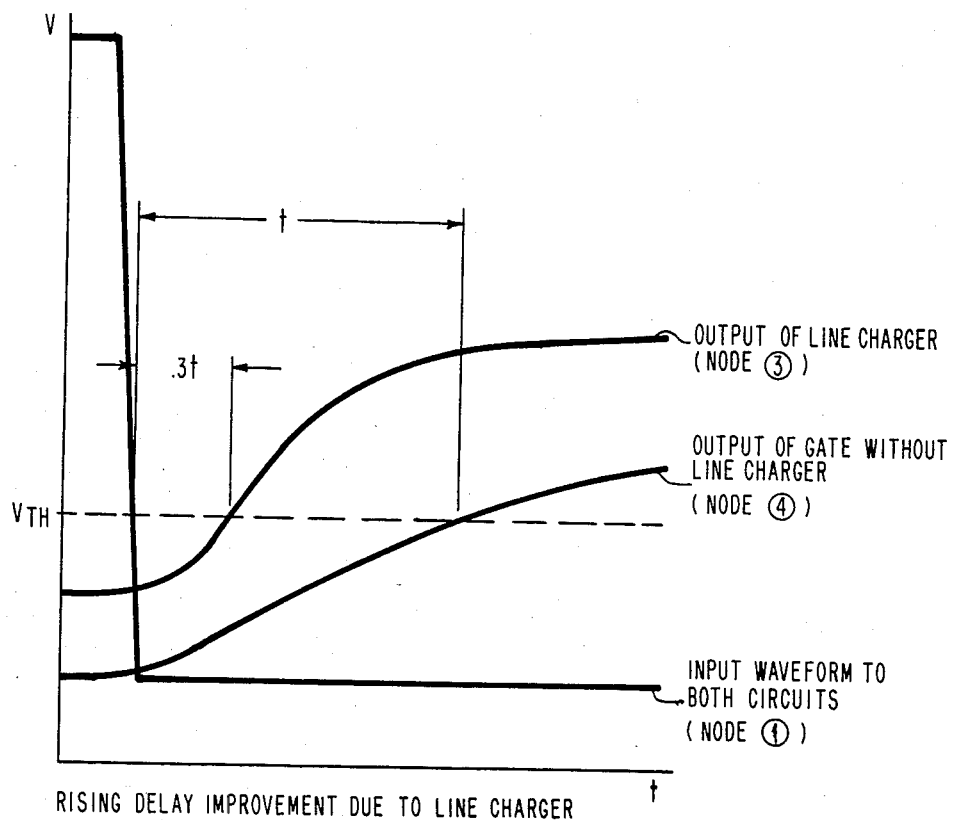
FIG. 4 discloses a plot showing the simulated response of TTL gates A and B (FIG. 3) to a falling transition. TTL gate B responded in time t. TTL gate A in cooperation with the line charger responded in time 0.3t.

The circuit shown in FIG. 3 was simulated in order to compare the switching speed of a TTL gate with the aid of a line charger (gate A) and of a TTL gate without the aid of a line charger (gate B). The voltage at node 4 the output of gate B, FIG. 4, rose to the threshold voltage in time t after being stimulated by the input voltage at node 1. The output voltage of the line charger, node 3, FIG. 3 responded to the input stimulus in 0.3t. Transistor T2 charges the capacitive load very rapidly. Transistor T3B isolates the capacitive load on the output from the input, during the up-going transition. Transistor T1 and resistor R1 transfer the fast up-going transition of the input to the base of the driving transistor T2. The 'line charger' is placed physically close to the driving TTL gate. Therefore, the input to the 'line charger' is only lightly loaded and fast. During the down-level transistor T3B is on and connects the output to the input. Summarizing, the 'line charger' circuit has an active up-going transition supported by T2, and an active down-going transition of the TTL circuit provided by T3B. Diode connected transistor T3A is used to reduce the inverse current in transistor T3B during saturation of T3B.

While this invention has been particularly described with reference to the preferred embodiments thereof, it will be understood by those skilled in the art that the foregoing and other changes in form and details may be made therein without departing from the spirit and scope of the invention.

What is claimed is:

1. In an integrated circuit chip, said integrated circuit chip comprising:
    at least first and second binary logic circuits, each of said at least first and second binary logic circuits having an input and an output;
    a highly capacitive load circuit, said load circuit having an input;
    said integrated circuit chip being characterized by the inclusion of a speedup circuit coupled between a common connection of said outputs of said at least first and second binary logic circuits and said highly capacitive load, said speed-up circuit comprising;
    first, second, third and fourth transistors, each of said first, second, third and fourth transistors having an emitter, base and collector,
    said collector of said first transistor, said base of said first transistor and said base of said second transistor connected in common,
    a first resistor connected between a source of potential and said collector of said first transistor,
    a second resistor connected between said source of potential and a common connection of said emitter of said third transistor, said base of said third transistor and said base of said fourth transistor,
    said collector of said second transistor connected to said source of potential,
    said emitter of said first transistor and said emitter of said fourth transistor connected in common to said outputs of said at least first and second binary logic circuits, and
    said emitter of said second transistor, said collector of said third transistor and said collector of said fourth transistor connected in common to said input of said highly capacitive load.

2. In an integrated circuit chip, as recited in claim 1, wherein said at least first and second binary logic circuits and said highly capacitive load circuit are respectively binary logic circuits of the TTL technology family.

3. In an integrated circuit chip, as recited in claim 2, wherein said at least first and second binary logic circuits and said highly capacitive load circuit are respectively binary logic circuits of the DTL technology family.

4. In an integrated circuit chip, as recited in claims 1 or 2, wherein at least said binary logic circuits connected to the input of said speed-up circuit include passive pull-up circuit means.

5. In an integrated circuit chip, as recited in claims 1 or 2, wherein at least said binary logic circuits connected to the input of said speed-up of circuit include passive pull-up circuit means comprising at least one resistor.

* * * * *